United States Patent
Kooriyama et al.

(10) Patent No.: US 10,014,237 B2
(45) Date of Patent: Jul. 3, 2018

(54) CIRCUIT BOARD HAVING A HEAT DISSIPATING SHEET WITH VARYING METAL GRAIN SIZE

(71) Applicant: KYOCERA Corporation, Kyoto-shi, Kyoto (JP)

(72) Inventors: Shinichi Kooriyama, Kirishima (JP); Narutoshi Ogawa, Kirishima (JP); Masashi Konagai, Kirishima (JP); Kensou Ochiai, Kawasaki (JP); Noritaka Niino, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/535,122

(22) PCT Filed: Dec. 14, 2015

(86) PCT No.: PCT/JP2015/084921
§ 371 (c)(1),
(2) Date: Jun. 12, 2017

(87) PCT Pub. No.: WO2016/098723
PCT Pub. Date: Jun. 23, 2016

(65) Prior Publication Data
US 2017/0352607 A1   Dec. 7, 2017

(30) Foreign Application Priority Data
Dec. 16, 2014 (JP) .................... 2014-254180

(51) Int. Cl.
*H01L 23/15* (2006.01)
*H01L 33/64* (2010.01)
(Continued)

(52) U.S. Cl.
CPC ...... *H01L 23/3735* (2013.01); *H01L 21/4857* (2013.01); *H01L 23/15* (2013.01);
(Continued)

(58) Field of Classification Search
CPC . H01L 23/3735; H01L 23/15; H01L 23/3736; H01L 33/641; H01L 51/529
See application file for complete search history.

(56) References Cited

U.S. PATENT DOCUMENTS 4,958,216 A * 9/1990 Tanaka .................. C04B 35/195
257/632
7,221,049 B2 * 5/2007 Igarashi ............. H01L 21/4857
257/700
(Continued)

FOREIGN PATENT DOCUMENTS

JP          08-139420 A        5/1996

*Primary Examiner* — Ida M Soward
(74) *Attorney, Agent, or Firm* — Volpe and Koenig, P.C.

(57) ABSTRACT

A circuit board includes an insulating substrate; a metal circuit sheet joined to a first principal surface of the insulating substrate; and a heat dissipating sheet made of metal and joined to a second principal surface of the insulating substrate, the second principal surface being opposite the first principal surface. The thickness of the heat dissipating sheet is at least 3.75 times the thickness of the metal circuit sheet. The size of metal grains contained in the heat dissipating sheet is smaller than the size of metal grains contained in the metal circuit sheet, and decreases with increasing distance from the second principal surface of the insulating substrate.

8 Claims, 9 Drawing Sheets

(51) Int. Cl.
*H01L 51/52* (2006.01)
*H01L 23/373* (2006.01)
*H01L 21/48* (2006.01)

(52) U.S. Cl.
CPC ........ *H01L 23/3736* (2013.01); *H01L 33/641* (2013.01); *H01L 51/529* (2013.01)

(56) References Cited

U.S. PATENT DOCUMENTS

| | | | | |
|---|---|---|---|---|
| 7,256,431 B2* | 8/2007 | Okamoto | ................... | C23C 4/02 257/177 |
| 8,273,993 B2* | 9/2012 | Kato | ................... | H01L 23/3735 174/252 |
| 8,946,882 B2* | 2/2015 | Kato | ................... | H01L 23/427 257/686 |
| 9,035,446 B2* | 5/2015 | Kimijima | ................ | H01L 23/42 257/687 |
| 9,190,342 B2* | 11/2015 | Paolella | ................. | H01L 23/42 |
| 9,196,563 B2* | 11/2015 | Sawai | .................... | B23K 35/26 |
| 9,287,187 B2* | 3/2016 | Yanagawa | ............. | H01L 25/072 |
| 9,362,242 B2* | 6/2016 | Iwata | ...................... | H01L 24/83 |
| 9,401,340 B2* | 7/2016 | Nishimoto | .............. | H01L 24/32 |
| 9,474,146 B2* | 10/2016 | Hori | ..................... | H01L 23/3735 |
| 2003/0207146 A1* | 11/2003 | Sasaki | ................... | H01L 23/498 428/627 |
| 2006/0191707 A1* | 8/2006 | Ishikawa | .................. | H05K 3/04 174/250 |
| 2009/0278162 A1* | 11/2009 | Wang | ........................ | C03C 8/02 257/99 |
| 2009/0294963 A1* | 12/2009 | Guth | ....................... | H01L 23/36 257/741 |
| 2012/0228757 A1* | 9/2012 | Kitami | .................... | H01L 23/36 257/713 |
| 2012/0305304 A1* | 12/2012 | Kato | ................... | H01L 23/3735 174/260 |
| 2013/0076347 A1* | 3/2013 | Toshida | ................ | G01R 33/10 324/219 |
| 2013/0119322 A1* | 5/2013 | Ide | ........................... | B22F 7/04 252/514 |
| 2014/0191399 A1* | 7/2014 | Ando | ...................... | H01L 24/36 257/746 |
| 2014/0284088 A1* | 9/2014 | Nakamura | ............. | H05K 1/092 174/257 |
| 2016/0181175 A1* | 6/2016 | Ikeda | ...................... | H01L 23/42 257/687 |
| 2016/0211195 A1* | 7/2016 | Sunachi | ............... | H05K 3/3431 |

* cited by examiner

CIRCUIT BOARD HAVING A HEAT DISSIPATING SHEET WITH VARYING METAL GRAIN SIZE

TECHNICAL FIELD

The present invention relates to a circuit board and an electronic device using the same.

BACKGROUND ART

Conventionally, circuit boards have been used in electronic devices in which an electronic component, such as an insulated gate bipolar transistor (IGBT) of a power module or a switching module, is mounted. For example, Patent Literature (PTL) 1 discloses a circuit board in which a metal circuit sheet made of copper and formed into a circuit pattern is joined to a first principal surface of an insulating substrate, and a heat dissipating sheet made of copper and configured to dissipate heat generated from an electronic component mounted on the metal circuit sheet is joined to a second principal surface of the insulating substrate.

Generally, in a circuit board such as that described above, the thickness of the heat dissipating sheet is set to be substantially the same as, or slightly less than, the thickness of the metal circuit sheet. This is to balance the stresses generated on the first and second principal surfaces of the insulating substrate to reduce warpage.

CITATION LIST

Patent Literature

PTL 1: Japanese Unexamined Patent Application Publication No. 8-139420

SUMMARY OF INVENTION

In a circuit board, such as that described above, the metal circuit sheet and the heat dissipating sheet are required to be thicker so as to more effectively dissipate heat generated from the electronic component mounted on the metal circuit sheet. For example, the total thickness of the heat dissipating sheet and the metal circuit sheet is required to be increased. However, making the metal circuit sheet and the heat dissipating sheet thicker may increase tensile stress applied to the surface of the insulating substrate. This causes the insulating substrate to crack in the cooling process after heating for joining the metal circuit sheet and the heat dissipating sheet to the insulating substrate, or due to temperature changes caused by heat generated by the operation of the electronic device including the circuit board.

A circuit board according to a first aspect of the present invention includes an insulating substrate; a metal circuit sheet joined to a first principal surface of the insulating substrate; and a heat dissipating sheet made of metal and joined to a second principal surface of the insulating substrate, the second principal surface being opposite the first principal surface. The thickness of the heat dissipating sheet is at least 3.75 times the thickness of the metal circuit sheet. The size of metal grains contained in the heat dissipating sheet is smaller than the size of metal grains contained in the metal circuit sheet, and decreases with increasing distance from the second principal surface of the insulating substrate.

An electronic device according to a second aspect of the present invention includes the circuit board described above and an electronic component mounted on the metal circuit sheet of the circuit board.

Advantageous Effects of Invention

In the circuit board according to the first aspect of the present invention, the metal circuit sheet joined to the first principal surface of the insulating substrate is thin. This allows the metal circuit sheet to plastically deform and follow, at a low load, the deformation of the circuit board caused by thermal expansion and contraction of the heat dissipating sheet made of metal and joined to the second principal surface of the insulating substrate. This can reduce stress applied to the insulating substrate. Also, making the heat dissipating sheet thicker can increase stiffness of the heat dissipating sheet.

The size of metal grains contained in the heat dissipating sheet is smaller than the size of metal grains contained in the metal circuit sheet. Therefore, the yield stress of the heat dissipating sheet is larger than that of the metal circuit sheet, and it is possible to reduce deformation of the heat dissipating sheet and increase stiffness of the heat dissipating sheet. The size of metal grains contained in the metal circuit sheet is larger than the size of metal grains contained in the heat dissipating sheet. Therefore, since the metal circuit sheet has smaller yield stress and follows the deformation of the circuit board at a lower load, stress applied to the insulating substrate can be further reduced. In a region distant from the second principal surface of the insulating substrate, the size of metal grains is relatively small. Therefore, yield stress is larger and stiffness is higher. In a region close to the second principal surface, the size of metal grains is relatively large. Therefore, yield stress is relatively small, and this relieves stress caused by a mismatch in thermal expansion between the insulating substrate and the heat dissipating sheet. It is thus possible to reduce deformation of the circuit board.

With the circuit board described above, the electronic device according to the second aspect of the present invention can effectively dissipate heat generated from the electronic component and can achieve high reliability.

DESCRIPTION OF EMBODIMENTS (First Embodiment)

Figure 1:
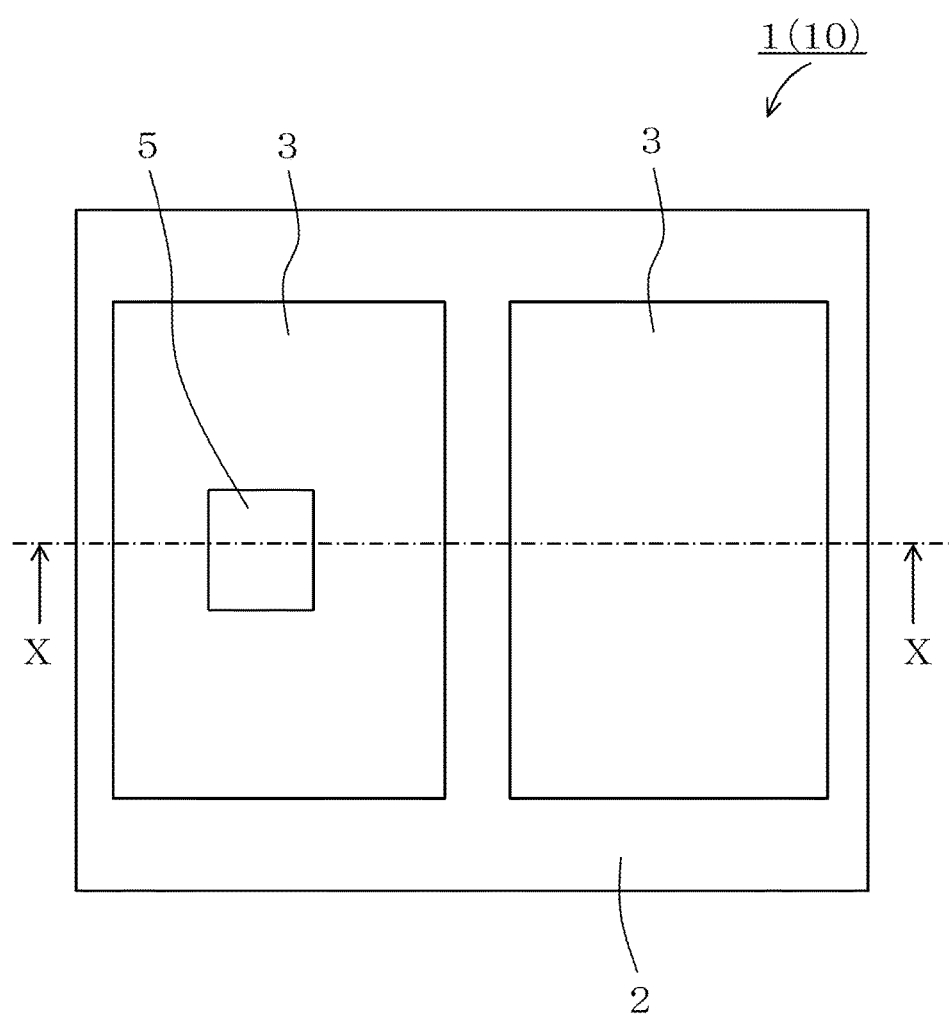
FIG. 1 is a top view of an electronic device according to a first embodiment of the present invention.

Illustrative embodiments of the present invention will now be described with reference to the drawings. In the drawings, a circuit board is placed in an xy plane in a virtual xyz space. In the present embodiment, "upward direction", "upper surface", and "upper part" correspond to the positive direction of a virtual z axis, and "downward direction", "lower surface", and "lower part" correspond to the negative direction of the virtual z axis.

A circuit board 1 according to an embodiment of the present invention will be described with reference to FIGS. 1 and 2. The circuit board 1 includes an insulating substrate 2, metal circuit sheets 3, and a heat dissipating sheet 4. In the example illustrated in FIGS. 1 and 2, an electronic device 10 includes the circuit board 1 and an electronic component 5. Note that a lower part of the heat dissipating sheet 4 is not shown, as the heat dissipating sheet 4 is thick as described below.

The insulating substrate 2 is made of an electrical insulating material. For example, the insulating substrate 2 is made of ceramic, such as aluminum oxide ceramic, mullite ceramic, silicon carbide ceramic, aluminum nitride ceramic, or silicon nitride ceramic. Among these ceramic materials, silicon carbide ceramic, aluminum nitride ceramic, and silicon nitride ceramic are preferable in terms of thermal conductivity which influences heat dissipation. In terms of strength, silicon nitride ceramic and silicon carbide ceramic are preferable among the ceramic materials described above.

When the insulating substrate 2 is made of a ceramic material with a relatively high strength, such as silicon nitride ceramic, the insulating substrate 2 is less likely to crack even when the metal circuit sheets 3 are thick. It is thus possible, in this case, to realize a circuit board that is small in size and capable of passing a large electric current.

For better thermal conductivity, it is preferable that the insulating substrate 2 be thinner. The insulating substrate 2 is, for example, about 0.1 mm to 1 mm thick. The thickness of the insulating substrate 2 may be selected in accordance with the size of the circuit board 1, or the thermal conductivity or strength of the material used. The insulating substrate 2 is, for example, about 30 mm to 50 mm long and about 40 mm to 60 mm wide in plan view.

For example, if made of silicon nitride ceramic, the insulating substrate 2 can be manufactured in the following manner. First, a ceramic green sheet (ceramic raw sheet) is formed by applying a conventionally known doctor blade method or calendar roll method to a slurry obtained by adding an appropriate organic binder, plasticizer, and solvent to base powder of silicon nitride, aluminum oxide, magnesium oxide, yttrium oxide, and the like and mixing them. Next, for example, the ceramic green sheet is appropriately die-cut into a predetermined shape, and a plurality of such sheets is stacked as necessary to form a compact. Then, the compact is fired in a non-oxidizing atmosphere, such as a nitrogen atmosphere, at a temperature of 1600° C. to 2000° C. The insulating substrate 2 is thus manufactured by the process described above.

The metal circuit sheets 3 are joined to the upper surface, which is a first principal surface, of the insulating substrate 2. The heat dissipating sheet 4 is joined to the lower surface, which is a second principal surface (opposite the first principal surface), of the insulating substrate 2. Hereinafter, the first principal surface may be simply referred to as "upper surface", and the second principal surface may be simply referred to as "lower surface".

The metal circuit sheets 3 and the heat dissipating sheet 4 are, for example, formed by performing predetermined metal processing, such as die-cutting, on a copper substrate (not shown), and then brazed to the insulating substrate 2.

The metal circuit sheets 3 and the heat dissipating sheet 4 are formed by being brazed to the insulating substrate 2. A brazing material (not shown in FIGS. 1 and 2) used for brazing contains, for example, copper and silver as main components and further contains, for example, titanium. The brazing material will be described in detail later on.

In the circuit board 1, the thickness of the heat dissipating sheet 4 is at least 3.75 times the thickness of the metal circuit sheets 3. Since the metal circuit sheets 3 are relatively thin, the metal circuit sheets 3 plastically deform to follow, at a low load, the deformation of the circuit board 1 caused by thermal expansion and contraction of the heat dissipating sheet 4 joined to the lower surface of the insulating substrate 2. This can reduce stress applied to the insulating substrate 2. Since the heat dissipating sheet 4 is relatively thick, the stiffness of the heat dissipating sheet is high.

The metal circuit sheets 3 and the heat dissipating sheet 4 contain metal grains, such as copper grains. The size of the metal grains contained in the heat dissipating sheet 4 is smaller than the size of the metal grains contained in the metal circuit sheets 3. In other words, the metal grains contained in the metal circuit sheets 3 are larger in size than the metal grains contained in the heat dissipating sheet 4.

Since the size of the metal grains contained in the heat dissipating sheet 4 is smaller than the size of the metal grains contained in the metal circuit sheets 3, the yield stress of the heat dissipating sheet 4 is larger than that of the metal circuit sheets 3. It is thus possible to improve stiffness of the heat dissipating sheet 4 and reduce its deformation. Since the size of the metal grains contained in the metal circuit sheets 3 is larger than the size of the metal grains contained in the heat dissipating sheet 4, the yield stress of the metal circuit sheets 3 is smaller. Therefore, the metal circuit sheets 3 follow the deformation of the circuit board 1 at a lower load. This can further reduce stress applied to the insulating substrate.

The size of the metal grains contained in the heat dissipating sheet 4 decreases with increasing distance from the lower surface (second principal surface) of the insulating substrate 2. In other words, the smaller the distance from the lower surface (second principal surface) of the insulating substrate 2, the larger the size of the metal grains contained in the heat dissipating sheet 4.

Examples of the grain sizes described above are as follows. That is, the size of the metal grains contained in the metal circuit sheets 3 is, for example, about 110 µm to 130 µm.

The size of the metal grains contained in the heat dissipating sheet 4 is, for example, about 40 µm to 100 µm, which is smaller than the size of the metal grains contained in the metal circuit sheets 3. In this case, the size of the metal grains contained in the heat dissipating sheet 4 is about 90 µm to 100 µm in the vicinity of the surface (upper surface) of the heat dissipating sheet 4 adjacent to the lower surface of the insulating substrate 2, and is about 40 µm to 50 µm in the vicinity of the opposite surface (lower surface) of the heat dissipating sheet 4.

The sizes of the metal grains described above can be detected, for example, by measuring the sizes of the metal grains through cross-sectional observation using a metallurgical microscope. In this case, the grain sizes are calculated by a method generally called a section method. The section method involves drawing a straight line on a sample cross-section, and counting the number of metal grains crossed by the straight line. Then, a length obtained by dividing the length of the straight line by the number of the counted metal grains is defined as a grain size. That is, the grain size in this case is a value representing the average size of the metal grains crossed by the straight line.

In a region distant from the lower surface of the insulating substrate 2, since the size of the metal grains contained in the heat dissipating sheet 4 is relatively small and thus the yield stress is relatively large, the stiffness of the heat dissipating sheet 4 can be improved. In a region close to the lower surface, the size of the metal grains contained in the heat dissipating sheet 4 is relatively large and thus the yield stress is relatively small. This relieves stress caused by a mismatch in thermal expansion between the insulating substrate 2 and the heat dissipating sheet 4, and thus can reduce deformation of the circuit board 1.

Since deformation of the circuit board 1 is reduced, it is possible to reduce stress applied to the insulating substrate 2 by the deformation, and thus to provide the circuit board 1 which not only ensures desired heat dissipation but also is advantageous in terms of reliability.

The size of the metal grains, such as copper grains, contained in the heat dissipating sheet 4 can be made smaller than the size of the metal grains, such as copper grains, contained in the metal circuit sheets 3, by the following method. That is, for example, the size of the metal grains in the metal circuit sheets 3 can be made larger by annealing the metal circuit sheets 3 in a vacuum or nitrogen, in advance, to recrystallize and grow the metal grains.

When the metal circuit sheets 3 and the heat dissipating sheet 4 are joined to the insulating substrate 2, an alloy containing a brazing material (e.g., copper-silver alloy) is formed on the metal circuit sheets 3 and the heat dissipating sheet 4 in the vicinity of their joined surfaces. The melting point of the alloy portion is lower than that of the metal (i.e., the main body of each of the metal circuit sheets 3 and the heat dissipating sheet 4). Therefore, in the joining process, the grains of the alloy portion start to grow at a low temperature, and the size of metal grains in the alloy portion (i.e., in the vicinity of the joined surfaces) increases.

When the metal circuit sheets 3 and the heat dissipating sheet 4 are simultaneously joined to the insulating substrate 2 without applying pre-processing, such as annealing, to the metal circuit sheets 3, the size of metal grains in the vicinity of the surfaces of the metal circuit sheets 3 joined to the insulating substrate 2 is the same as the size of metal grains in the vicinity of the surface of the heat dissipating sheet 4 joined to the insulating substrate 2. However, since the heat dissipating sheet 4 is thicker than the metal circuit sheets 3, the heat dissipating sheet 4 has many regions where the size of metal grains is small. This means that the average size of the metal grains in the heat dissipating sheet 4 is smaller than that in the metal circuit sheets 3. Thus, as described above, the stiffness of the heat dissipating sheet 4 is high, and stress caused by deformation of the insulating substrate 2 can be reduced.

The size of the metal grains, such as copper grains, contained in the heat dissipating sheet 4 can be reduced with increasing distance from the principal surface (second principal surface) of the insulating substrate 2 (i.e., toward the lower side in the present embodiment) by the following method. That is, for example, when the heat dissipating sheet 4 is joined to the insulating substrate 2, a brazing material having a high ability to diffuse its components into metal (metal grains) forming the heat dissipating sheet 4 may be used, and an alloy portion containing the brazing material and the metal may be widened (or made thicker) in the thickness direction. Since the amount of diffusion of components of the brazing material decreases with increasing distance from the principal surface (second principal surface) of the insulating substrate 2, the growth of metal grains slows down and the size of the metal grains can be gradually reduced in the thickness direction. Additionally, since the alloy portion is widened in the thickness direction, the size of the metal grains can be varied over a wide range.

Figure 2:
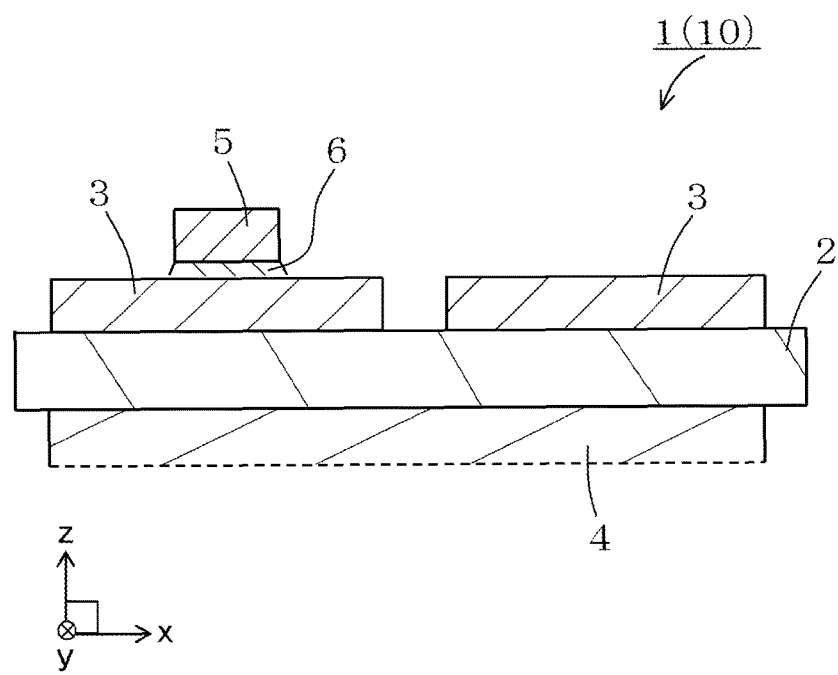
FIG. 2 is a cross-sectional view of the electronic device taken along line X-X of FIG. 1.

As illustrated in FIGS. 1 and 2, the electronic component 5 is mounted on the upper surface of one of the metal circuit sheets 3, with a joining material 6 interposed therebetween. The electronic component 5 is connected to the other metal circuit sheet 3 by a conductive connecting member (bonding wire) not shown. Thus, in the example illustrated in FIGS. 1 and 2, the metal circuit sheets 3 are formed into a circuit pattern and serve as circuit conductors. The heat dissipating sheet 4 has the function of dissipating heat generated from the electronic component 5 mounted on the metal circuit sheet 3.

Besides being used as circuit conductors, the metal circuit sheets 3 may be used as metal members for mounting the electronic component 5 on the circuit board 1, as metal members for grounded conductors, or as heat dissipating sheets. The metal circuit sheets 3 are joined to the insulating substrate 2 of ceramic or the like, and used as conduction paths for passage of a relatively large electric current of about, for example, several hundreds of amperes, or as heat dissipating members.

The electronic component 5 is, for example, a semiconductor element, such as a transistor, a large-scale integrated circuit (LSI) for a central processing unit (CPU), an insulated gate bipolar transistor (IGBT), or a metal-oxide-semiconductor field-effect transistor (MOS-FET).

The joining material 6 is made of, for example, metal or conductive resin. The joining material 6 is, for example, solder, an alloy of gold and tin (Au—Sn alloy), or an alloy of tin, silver, and copper (Sn—Ag—Cu alloy).

A plating film may be formed on the surface of each of the metal circuit sheets 3 by a plating method. This improves wettability with the joining material 6, and allows the electronic component 5 to be firmly joined to the surface of the metal circuit sheet 3. The plating film may be of any metal with high conductivity and corrosion resistance. Examples of the metal include nickel, cobalt, copper, gold, and alloy materials containing these metal materials as main components. The thickness of the plating film may be, for example, 1.5 µm to 10 µm.

When nickel is used as a material for the plating film, the plating film is preferably made of, for example, a nickel-phosphorus amorphous alloy of nickel containing about 8% to 15% phosphorus by mass. In this case, it is possible to reduce surface oxidation of the nickel plating film, and maintain wettability of the electronic component 5 with the joining material 6 and the like for a long time. Additionally, when nickel contains about 8% to 15% phosphorus by mass, the nickel-phosphorus amorphous alloy can be formed easily. This can improve the adhesive strength of the joining material 6 and the like to the plating film.

(Second Embodiment)

Figure 3:
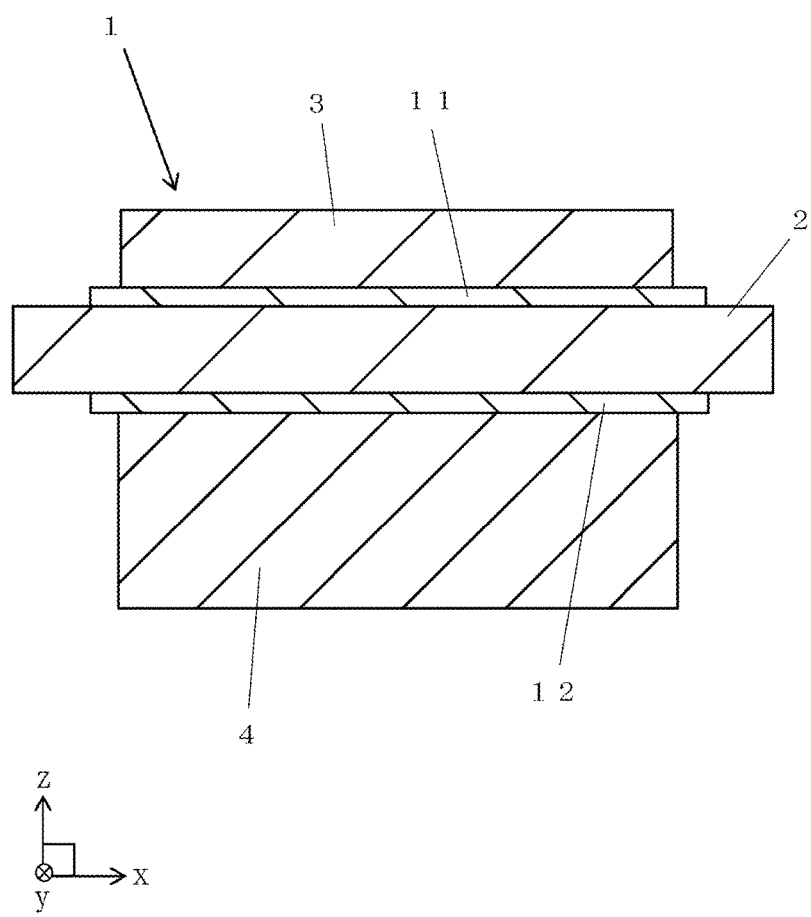
FIG. 3 is a cross-sectional view of a circuit board according to a second embodiment of the present invention.
Figure 4:
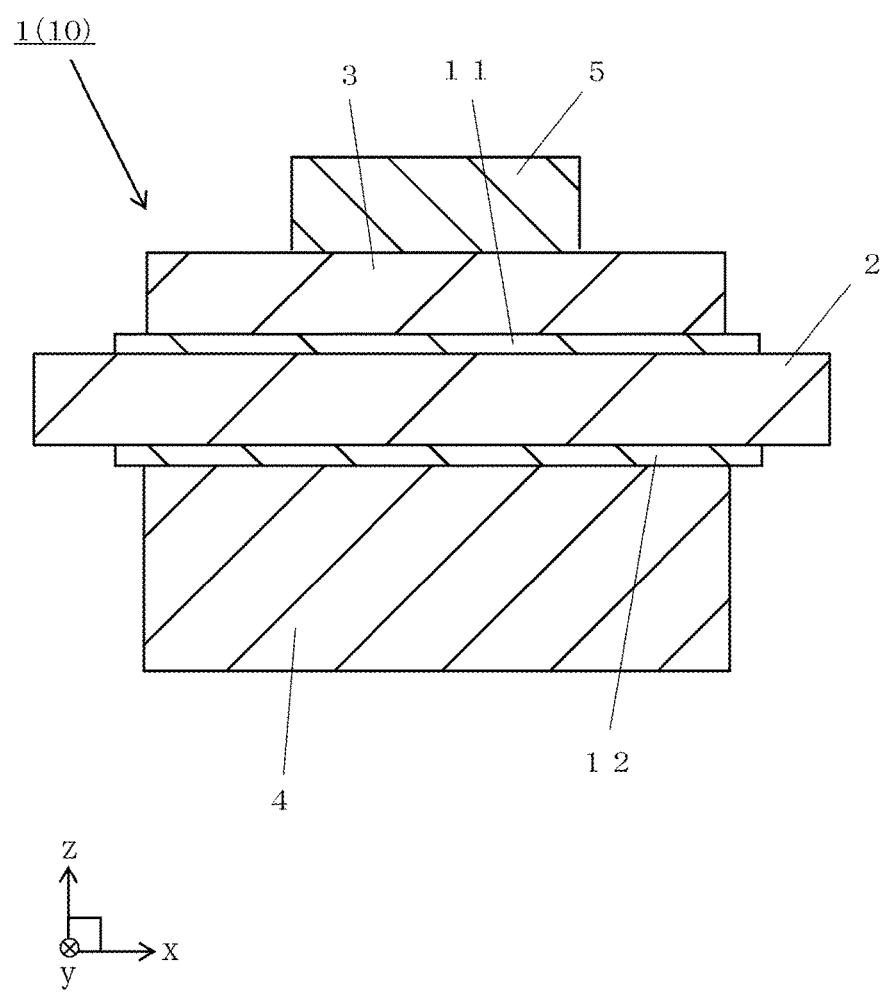
FIG. 4 is a cross-sectional view of an electronic device according to the second embodiment of the present invention.

FIG. 3 is a cross-sectional view of the circuit board 1 according to a second embodiment of the present invention. In the second embodiment, the circuit board 1 includes the insulating substrate 2, the metal circuit sheet 3, the heat dissipating sheet 4, a first brazing material 11, and a second brazing material 12. FIG. 4 is a cross-sectional view of the electronic device 10 according to the second embodiment of the present invention. In the example illustrated in FIG. 4, the electronic device 10 includes the circuit board 1 and the electronic component 5.

In the circuit board 1 of the second embodiment, the metal circuit sheet 3 is joined by the first brazing material 11 to the upper surface of the insulating substrate 2. The heat dissipating sheet 4 is joined by the second brazing material 12 to the lower surface of the insulating substrate 2. The first brazing material 11 has, at least in an outer portion thereof, a thermal expansion coefficient higher than the thermal expansion coefficient of the second brazing material 12. This configuration enhances the advantageous effects (e.g., reduction of cracks in the insulating substrate 2) in the circuit board 1 and the electronic device 10 of the first embodiment. The second embodiment is the same as the first embodiment, except the first brazing material 11 and the second brazing material 12. The description of the same points as in the first embodiment will be omitted.

The first brazing material 11 that joins the metal circuit sheet 3 to the insulating substrate 2 has, at least in the outer portion thereof, a thermal expansion coefficient higher than the thermal expansion coefficient of the second brazing material 12 that joins the heat dissipating sheet 4 to the insulating substrate 2. This produces a force that causes the outer portion of the circuit board 1 to warp. This force has a direction opposite that of thermal stress caused by a difference in thermal expansion coefficient between the heat dissipating sheet 4 and the insulating substrate 2 having a thermal expansion coefficient lower than that of the heat dissipating sheet 4. Therefore, these forces cancel each other out, and effectively reduce the possibility of warpage of the entire circuit board 1.

It is thus possible to more effectively reduce mechanical breakage, such as cracks, in the insulating substrate 2 caused by warpage of the entire circuit board 1. That is, the circuit board 1 can be provided, which has less occurrence of cracks or the like in the insulating substrate 2 and allows manufacture of the electronic device 10 having high long-term reliability.

The outer portion of the first brazing material 11 is at least a portion located outside the outer periphery of the metal circuit sheet 3 (i.e., a portion that can be seen without being hidden by the metal circuit sheet 3 when viewed from above). The outer portion may include a portion located slightly inside the outer periphery of the metal circuit sheet 3.

A concrete example will now be given. When the electronic component 5 is mounted on the circuit board 1 of the embodiment and heat is generated by starting the electronic component 5 (i.e., when temperature rises), a force that causes the outer portion of the circuit board 1 to warp downward is produced in the outer portion of the first brazing material 11. At the same time, thermal stress that causes the outer portion of the circuit board 1 to warp upward is produced by a difference in thermal expansion coefficient between the heat dissipating sheet 4 and the insulating substrate 2. That is, forces of opposite directions are produced on the upper and lower sides of the circuit board 1 (insulating substrate 2). These forces cancel each other out, and thus effectively reduce the possibility of warpage of the entire circuit board 1.

When the electronic component 5 in operation is stopped and heat is dissipated (i.e., when temperature drops), forces of opposite directions are also produced on the upper and lower sides of the circuit board 1 (insulating substrate 2) and cancel each other out.

Such forces can cancel each other out not only when the electronic component 5 is started or stopped, but also when thermal changes, such as heating and heat dissipation associated with joining (or brazing) of the heat dissipating sheet 4 and the insulating substrate 2, take place. Therefore, it is possible to effectively reduce mechanical breakage, such as cracks, in the insulating substrate 2 caused by warpage of the entire circuit board 1.

In the circuit board 1 and the electronic device 10 of the embodiment described above, the first brazing material 11 and the second brazing material 12 contain, for example, the following components. That is, the first brazing material 11 and the second brazing material 12 contain at least one of copper and silver as a main component, and further contain, as an additional material, at least one of the following types of active metal materials for a joining purpose: molybdenum, titanium, zirconium, hafnium and niobium. When effectiveness, brazing workability, and economy (cost) of active metals are taken into account, molybdenum, titanium and zirconium are particularly suitable as active metals for the purpose described above.

The first brazing material 11 contains, at least in the outer portion thereof, a lower percentage of additional materials, such as molybdenum, titanium and zirconium, than the second brazing material 12. In other words, at least the outer portion of the first brazing material 11 contains a higher percentage of the main component (at least one of copper and silver) than the second brazing material 12. Therefore, the first brazing material 11 has, at least in the outer portion thereof, a thermal expansion coefficient higher than that of the second brazing material 12. When the thermal expansion coefficient of each metal is expressed as a linear expansion coefficient at 20° C. (about 293 K), copper has a thermal expansion coefficient of $16.5 \times 10^{-6}$ 1/K, silver has a thermal expansion coefficient of $18.9 \times 10^{-6}$ 1/K, molybdenum has a thermal expansion coefficient of $3.7 \times 10^{-6}$ 1/K, titanium has a thermal expansion coefficient of $8.6 \times 10^{-6}$ 1/K, and zirconium has a thermal expansion coefficient of $5.4 \times 10^{-6}$ 1/K (see Chronological Scientific Tables, 2011, 84th printing).

The outer portion of the first brazing material 11 contains, for example, about 15% to 80% copper by mass, about 15% to 65% silver by mass, about 1% to 20% titanium by mass, and about 0% to 5% molybdenum by mass. The second brazing material 12 contains, for example, about 15% to 75% copper by mass, about 15% to 65% silver by mass, about 1% to 20% titanium by mass, and about 0% to 5% molybdenum by mass.

More concrete examples are as follows. That is, the outer portion of the first brazing material 11 contains 80% copper by mass, 19.3% silver by mass, 0.5% titanium by mass, and 0.2% molybdenum by mass. When the outer portion of the first brazing material 11 has this composition, the second brazing material 12 contains 70% copper by mass, 25.5% silver by mass, 4% titanium by mass, and 0.5% molybdenum by mass.

The composition of the first brazing material 11 in the remaining portion, other than the outer portion described above, may be the same as that in the outer portion or of the second brazing material 12.

The composition of the first brazing material 11 in the center portion (e.g., a portion located on the lower side of the metal circuit sheet 3) inside the outer portion described above may be the same as that in the outer portion or of the second brazing material 12.

To make the percentage of additional materials, such as molybdenum, titanium and zirconium, contained in the outer portion of the first brazing material 11 lower than that in the second brazing material 12, the additional materials may be, for example, eluted into an aqueous solution of ferric chloride (III) ($FeCl_3$) to reduce their percentage in the outer portion.

A material containing a lower percentage of additional materials than the second brazing material 12 may be used as the first brazing material 11. In this case, the thermal expansion coefficient of the entire first brazing material 11 is higher than that of the second brazing material 12.

Figure 5:
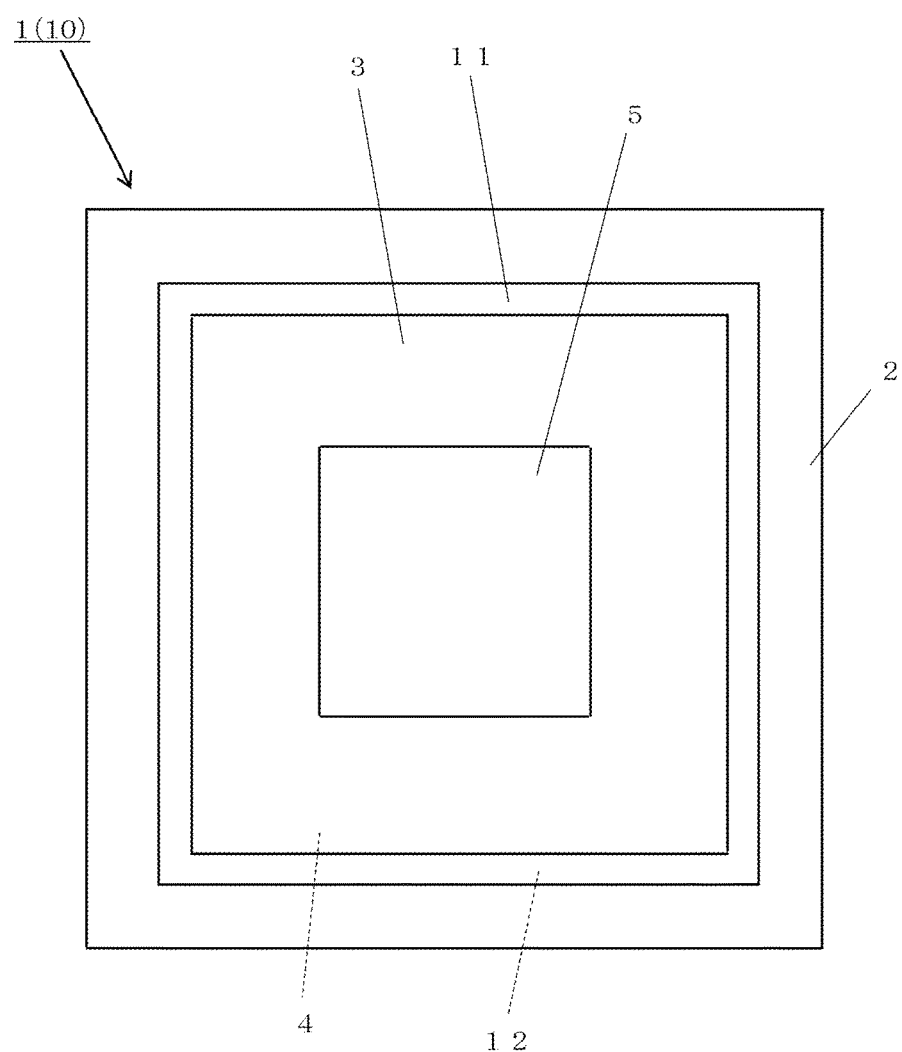
FIG. 5 is a plan view of the circuit board and the electronic device according to the second embodiment of the present invention.

In the circuit board 1 and the electronic device 10 illustrated in FIGS. 3 and 4, a part of the outer portion of the first brazing material 11 is located outside the outer periphery of the metal circuit sheet 3. That is, for example as illustrated in FIG. 5, the outer portion of the first brazing material 11 may be at least partly located outside the outer periphery of the metal circuit sheet 3. In other words, the first brazing material 11 may partly extend outside the space between the metal circuit sheet 3 and the insulating substrate 2. Note that FIG. 5 is a plan view of the circuit board 1 and the electronic device 10 according to the second embodiment of the present invention. In FIG. 5, the same elements as those in FIGS. 3 and 4 are denoted by the same reference numerals.

In the circuit board 1 and the electronic device 10 of the example illustrated in FIGS. 3 to 5, the outer periphery of the first brazing material 11 substantially coincides with the outer periphery of the second brazing material 12 when viewed from above (in perspective plan view). At the same time, the outer periphery of the metal circuit sheet 3 substantially coincides with the outer periphery of the heat dissipating sheet 4. Therefore, the outer peripheries of the heat dissipating sheet 4 and the second brazing material 12 cannot be seen in FIG. 5, as they coincide with the outer peripheries of the metal circuit sheet 3 and the first brazing material 11.

As described above, when the outer portion of the first brazing material 11 is at least partly located outside the outer periphery of the metal circuit sheet 3, the first brazing material 11 having a relatively high thermal expansion coefficient extends to the outside of the metal circuit sheet 3, that is, to a position close to the outer periphery of the entire circuit board 1. This produces a force that causes the circuit board 1 to warp, at a position closer to the outer periphery of the circuit board 1, in a direction opposite that of warpage caused by the heat dissipating sheet 4. Thus, on the upper side of the circuit board 1 (insulating substrate 2), a force that effectively cancels out the force on the lower side of the circuit board 1 (insulating substrate 2) can be produced. The warpage of the entire circuit board 1 can thus be more effectively reduced.

In the circuit board 1 and the electronic device 10 illustrated in FIGS. 3 and 4, the outer periphery of the first brazing material 11 is located outside the outer periphery of the heat dissipating sheet 4 in perspective plan view. This configuration has the same advantageous effects as those achieved when the outer portion of the first brazing material 11 is at least partly located outside the outer periphery of the metal circuit sheet 3.

Figure 6A:
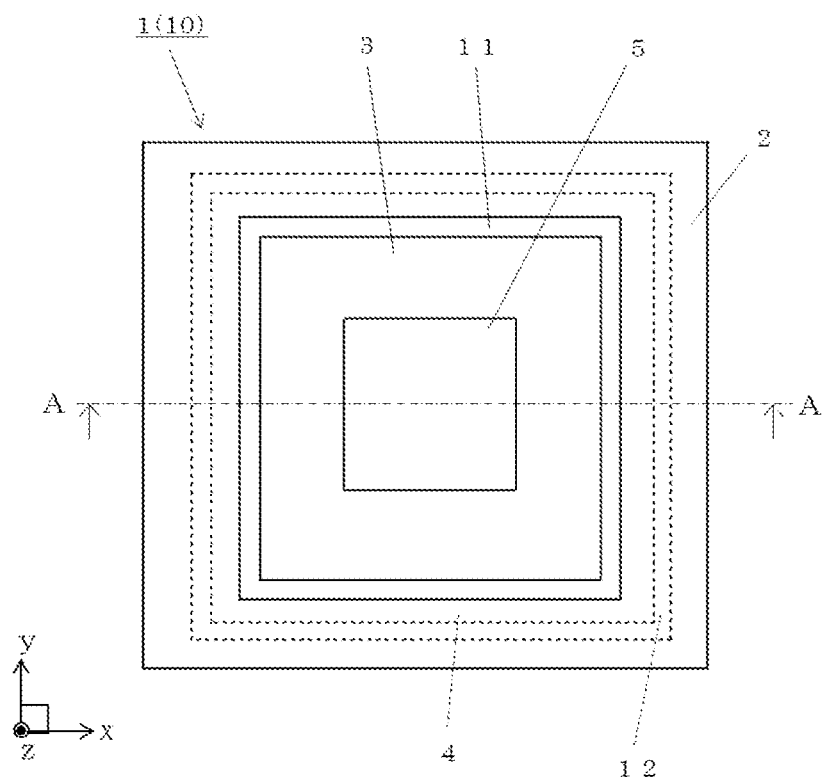
FIG. 6A is a plan view illustrating a first modification of the circuit board and the electronic device illustrated in FIG. 5.
Figure 6B:
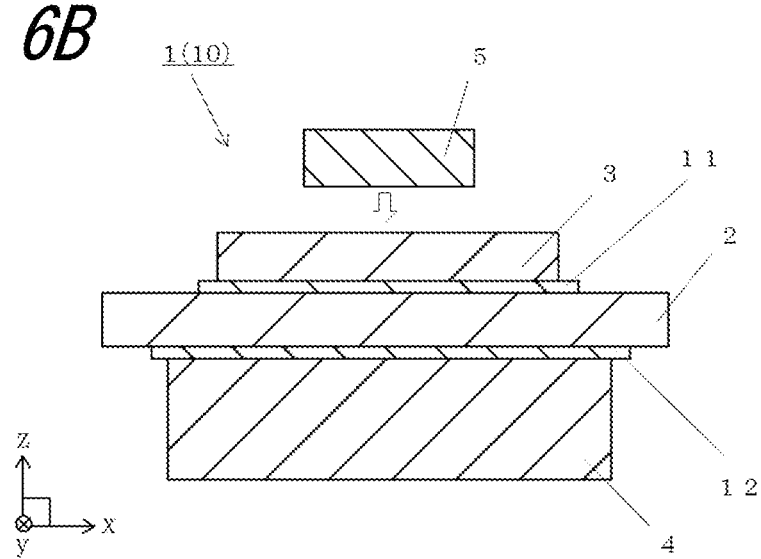
FIG. 6B is a cross-sectional view taken along line A-A of FIG. 6A.

FIG. 6A is a plan view illustrating a first modification of the circuit board 1 and the electronic device 10 illustrated in FIG. 5, and FIG. 6B is a cross-sectional view taken along line A-A of FIG. 6A. In FIGS. 6A and 6B, the same elements as those in FIG. 5 are denoted by the same reference numerals. In FIG. 6B, the electronic component 5 is separate from the circuit board 1. The electronic device 10 is manufactured by mounting the electronic component 5 onto the circuit board 1 in the direction of arrow.

In the example illustrated in FIGS. 6A and 6B, the outer periphery of the heat dissipating sheet 4 is located outside the outer periphery of the first brazing material 11 in perspective plan view. This is effective in increasing the stiffness of the heat dissipating sheet 4 to reduce the possibility of warpage of the entire circuit board 1. This is also effective in increasing the area of the exposed surface (i.e., the surface area in contact with the outside air) of the heat dissipating sheet 4 to improve heat dissipation.

Figure 7A:
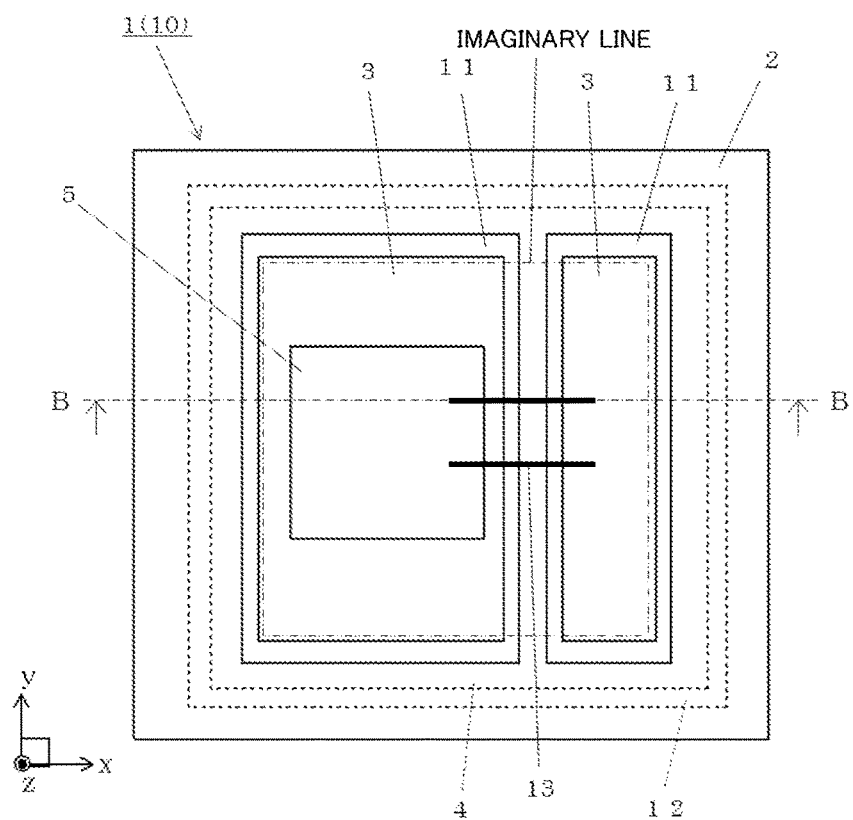
FIG. 7A is a plan view illustrating a second modification of the circuit board and the electronic device illustrated in FIG. 5.
Figure 7B:
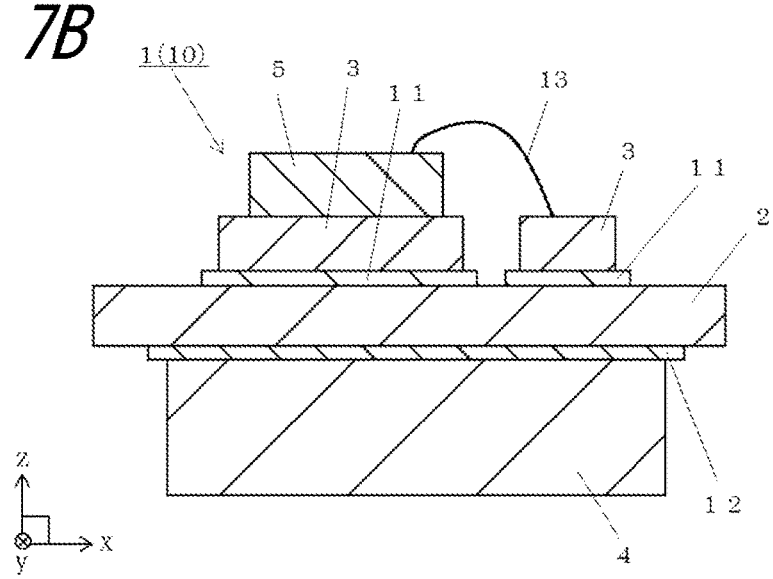
FIG. 7B is a cross-sectional view taken along line B-B of FIG. 7A.

Various other modifications can be made to the circuit board 1 and the electronic device 10 of the second embodiment. For example, as illustrated in FIGS. 7A and 7B, the circuit board 1 may include a plurality of metal circuit sheets 3. FIG. 7A is a plan view illustrating a second modification of the circuit board 1 and the electronic device 10 illustrated in FIG. 5, and FIG. 7B is a cross-sectional view taken along line B-B of FIG. 7A. In FIGS. 7A and 7B, the same elements as those in FIG. 5 are denoted by the same reference numerals.

The metal circuit sheets 3 include, for example, one for mounting (or joining) the electronic component 5, and the other for a connection circuit electrically connected to the electronic component 5. The electronic component 5 and the metal circuit sheet 3 for a connection circuit are electrically connected to each other by conductive connecting members 13, such as bonding wires. The metal circuit sheet 3 for a connection circuit may be divided into a plurality of parts.

The outer portion of the first brazing material 11 in this case is the outer portion of each first brazing material 11 by which one of the metal circuit sheets 3 is joined to the insulating substrate 2. In this case, the stress described above can be effectively cancelled out as long as the outer portion of each first brazing material 11 by which one of the metal circuit sheets 3 is joined to the insulating substrate 2 has, at least in a part thereof close to the outer periphery of the upper surface of the insulating substrate 2 (i.e., in a part outside the imaginary line indicated by a two-dot chain line), a thermal expansion coefficient higher than that of the second brazing material 12.

The thermal expansion coefficient of the entire first brazing material 11 may be higher than that of the second brazing material 12. In this case, it is also possible to effectively cancel out the stress described above.

(Example of Thermal Simulation)

Figure 8:
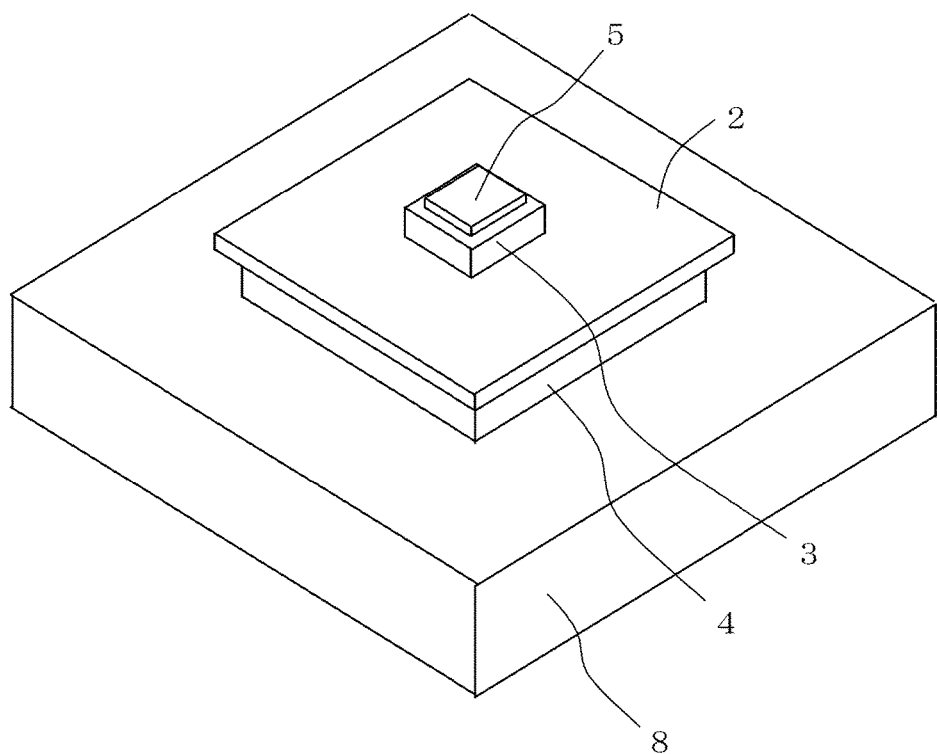
FIG. 8 is a perspective view illustrating an external appearance of a model used in a thermal simulation.
Figure 9:
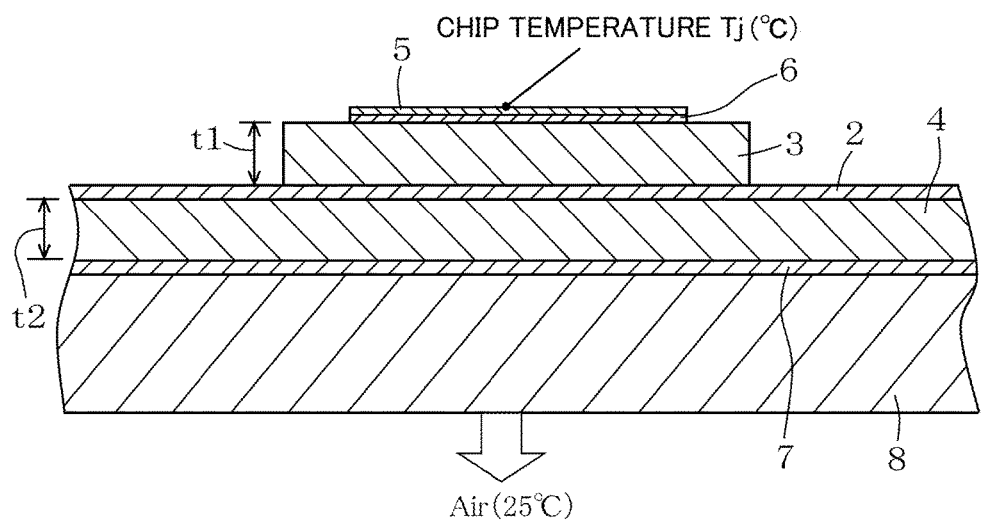
FIG. 9 is a cross-sectional view of the model illustrated in FIG. 8.

A chip (electronic component 5) was mounted on the metal circuit sheet 3 of the circuit board 1 configured as described above, and the circuit board 1 was mounted on a heat sink 8. Then, a thermal simulation was performed, in which a chip temperature Tj of the chip heated to generate a predetermined amount of heat was measured while varying the thicknesses of the metal circuit sheet 3 and the heat dissipating sheet 4, so as to examine the influence of the thicknesses of the metal circuit sheet 3 and the heat dissipating sheet 4 on heat dissipation. FIG. 8 is a perspective view illustrating an external appearance of a model used in the thermal simulation. FIG. 9 is a cross-sectional view of the model illustrated in FIG. 8.

While not shown in FIGS. 8 and 9, the metal circuit sheet 3 is joined to the insulating substrate 2 with a first brazing material interposed therebetween, and the heat dissipating sheet 4 is joined to the insulating substrate 2 with a second brazing material interposed therebetween, as in the second embodiment. In this example, the first brazing material has a thermal expansion coefficient of $16.9 \times 10^{-6}$ 1/K in an outer portion thereof located outside the metal circuit sheet 3, and has a thermal expansion coefficient of 16.7×10$^{-6}$ 1/K in a center portion thereof inside the outer portion (i.e., in a portion located on the lower side of the metal circuit sheet 3). The second brazing material has a thermal expansion coefficient of 16.7×10$^{-6}$ 1/K.

The thermal simulation was performed, with conditions of each element set as shown below in Table 1. The predetermined amount (described above) of heat generation of the chip was adjusted and fixed such that the chip temperature Tj was 175° C. when the thicknesses t1 and t2 of the metal circuit sheet 3 and the heat dissipating sheet 4 were both 1.8 mm (equivalent to a size demanded by the market).

TABLE 1

| ELEMENT | ASSUMED MATERIAL | SIZE (mm) | THERMAL CONDUCTIVITY (W/mK) |
|---|---|---|---|
| CHIP (ELECTRONIC COMPONENT) 5 | Si | 10 × 10 × 0.1 | 170 |
| JOINING MATERIAL 6 | Pb-FREE SOLDER | 10 × 10 × 0.05 | 60 |
| METAL CIRCUIT SHEET 3 | Cu | 14 × 14 × t1 | 400 |
| INSULATING SUBSTRATE 2 | Si$_3$N$_4$ | 50 × 50 × 0.32 | 90 |
| HEAT DISSIPATING SHEET 4 | Cu | 46 × 46 × t2 | 400 |
| JOINING MATERIAL 7 | GREASE | 46 × 46 × 0.1 | 1 |
| HEAT SINK 8 | Al | 200 × 200 × 10 | 240 |

As shown in Table 1, since the metal circuit sheet 3 for mounting the chip 5 thereon cannot be made much larger than the chip 5 because of the need for integration, the metal circuit sheet 3 is set to be only 2 mm larger in size than the chip 5 on each side. Although, as illustrated in FIGS. 1 and 2, the other metal circuit sheet 3 is provided near the metal circuit sheet 3 having the chip 5 mounted thereon, the other metal circuit sheet 3 is ignored as it has little influence on heat dissipation of the chip 5. The brazing material between the metal circuit sheet 3 and the insulating substrate 2 and the brazing material between the insulating substrate 2 and the heat dissipating sheet 4 are also ignored, as they are too thin to significantly influence the heat dissipation.

Table 2 shows a result of a reliability test on the circuit board 1 of the embodiment. The amount of heat generation of the chip was set such that Tj was 175° C. when the thicknesses t1 and t2 of the metal circuit sheet 3 and the heat dissipating sheet 4 were both 1.8 mm. Then, heat dissipation was rated as "very good" (A) for the chip temperature Tj not exceeding 175° C., "good" (B) for Tj exceeding 175° C. and not exceeding 205° C., and "poor" (D) for Tj exceeding 205° C. Note that the assessment "good" (B) is for Tj obtained when the thicknesses t1 and t2 of the metal circuit sheet 3 and the heat dissipating sheet 4 were both 0.8 mm.

Reliability was rated as "very good" (A) when the number of cycles before breakage of the insulating substrate 2 was 700 or more, "good" (B) when the number of cycles was 500 or more and less than 700, "fair" (C) when the number of cycles was 300 or more and less than 500, and "poor" (D) when failure occurred before the number of cycles reached 300, which is as low as the level of reliability in a conventional technique. Here, the conventional technique refers to a sample which exhibited relatively good heat dissipation among conventional techniques and in which the thicknesses t1 and t2 of the metal circuit sheet 3 and the heat dissipating sheet 4 were both 0.8 mm.

Reliability was evaluated by preparing samples with conditions shown in Table 2, and performing a reliability test on the samples under temperature cycling. The samples were each obtained by joining the metal circuit sheet 3 made of copper and measuring 18 mm×18 mm×t1 to the first principal surface of the insulating substrate 2 formed by a plate-like (i.e., thin and rectangular) sintered silicon nitride body measuring 25 mm×25 mm×0.32 mm, and joining the heat dissipating sheet 4 made of copper and measuring 18 mm×18 mm×t2 to the second principal surface of the insulating substrate 2. The metal circuit sheet 3 and the heat dissipating sheet 4 were joined to the insulating substrate by active metal joining using a brazing material obtained by mixing a titanium component with silver and copper.

For each of the samples, the size of metal grains in the metal circuit sheet 3 was set to 110 μm to 130 μm, and the size of metal grains in the heat dissipating sheet 4 was set to 90 μm to 100 μm on the side adjacent to the lower surface of the insulating substrate 2 and 40 μm to 50 μm on the opposite side.

The reliability test took into account reliability when an IGBT chip, which has been used as a chip in recent years, was mounted, and the temperature conditions were set to −40° C. on the lower temperature side and 175° C. on the higher temperature side for accommodating high-temperature operation of the chip. The samples were taken out every 100 cycles of the temperature cycling, observed using a stereoscopic microscope, and evaluated as passed (or rated as A, B, or C) when there was no peeling of the metal circuit sheet 3 or the heat dissipating sheet 4 from the insulating substrate 2, and there were no cracks in the insulating substrate 2.

For each combination of the thicknesses t1 and t2 of the metal circuit sheet 3 and the heat dissipating sheet 4, Table 2 also shows a result of evaluation of the manufacturing cost of the circuit board 1. Additionally, Table 2 shows an overall assessment made by taking into account the three items, heat dissipation, reliability, and cost. The cost means the element cost of the heat dissipating sheet 4. The cost was rated as "very good" (A) when the thickness t2 of the heat dissipating sheet 4 was 5 mm or less, and "fair" (C) when the thickness t1 of the metal circuit sheet 3 was 1 mm or more and it took considerable time to perform etching for forming a circuit. The overall assessment was made by using the lowest rating of the three items, heat dissipation, reliability, and cost.

Also in Table 2, when reliability is rated as D, the overall assessment is also D. However, the overall assessment takes into account various criteria related to practicality of the circuit board 1. Therefore, there are some samples whose results of overall assessment (e.g., B or C) are lower than their results of reliability assessment (e.g., A or B). In other words, if the overall assessment for a sample is A, the sample can be regarded as the circuit board 1 which has effectively improved reliability and is suitable for practical use.

TABLE 2

| METAL CIRCUIT SHEET THICKNESS t1 (mm) | HEAT DISSIPATING SHEET THICKNESS t2 (mm) | t2/t1 | HEAT DISSIPATION | RELIABILITY | COST | OVERALL ASSESSMENT |
|---|---|---|---|---|---|---|
| 0.4 | 1 | 2.5 | D | D | A | D |
|  | 2 | 5 | B | C | A | C |
|  | 3 | 7.5 | A | A | A | A |
|  | 4 | 10 | A | A | A | A |
|  | 5 | 12.5 | A | A | A | A |
|  | 6 | 15 | A | A | B | B |
| 0.6 | 1 | 1.67 | B | D | A | D |
|  | 2 | 3.33 | B | D | A | D |
|  | 3 | 5 | A | A | A | A |
|  | 4 | 6.67 | A | A | A | A |
|  | 5 | 8.33 | A | A | A | A |
|  | 6 | 10 | A | A | B | B |
| 0.8 | 0.8 | 1 | B | D | A | D |
|  | 1 | 1.25 | B | D | A | D |
|  | 2 | 2.5 | B | D | A | D |
|  | 3 | 3.75 | A | A | A | A |
|  | 4 | 5 | A | A | A | A |
|  | 5 | 6.25 | A | A | A | A |
|  | 6 | 7.5 | A | A | B | B |
| 1 | 1 | 1 | B | D | C | D |
|  | 2 | 2 | B | D | C | D |
|  | 3 | 3 | A | D | C | D |
|  | 4 | 4 | A | B | C | C |
|  | 5 | 5 | A | B | C | C |
|  | 6 | 6 | A | B | C | C |

Referring to each of the items, heat dissipation and reliability, shown in Table 2, it is possible to improve reliability while ensuring desired heat dissipation by setting the thickness t1 of the metal circuit sheet 3 and the thickness t2 of the heat dissipating sheet 4 such that the thickness t2 is at least 3.75 times the thickness t1.

When the thicknesses t1 and t2 of the metal circuit sheet 3 and the heat dissipating sheet 4 are set such that the thickness t1 of the metal circuit sheet 3 joined to the upper surface of the insulating substrate 2 is 0.8 mm or less, the thickness t2 of the heat dissipating sheet 4 joined to the lower surface of the insulating substrate 2 is 3 mm or more, and the sum of the thickness t1 of the metal circuit sheet 3 and the thickness t2 of the heat dissipating sheet 4 is 3.4 mm or more, then it is possible to further improve heat dissipation while reducing cost. When the thickness t1 of the metal circuit sheet 3 is 0.8 mm or less, the thickness t2 of the heat dissipating sheet 4 is 3 mm or more, and the sum of t1 and t2 is 3.4 mm or more, then the reliability of any sample is rated as A or B, which is a good result. That is, this configuration is effective in further improving reliability.

Improvement of reliability may be explained as follows. That is, when the metal circuit sheet 3 joined to the upper surface of the insulating substrate 2 is thin, the metal circuit sheet 3 plastically deforms to follow, at a low load, the thermal expansion and contraction of the heat dissipating sheet 4 joined to the lower surface of the insulating substrate 2. It is thus possible to reduce stress applied to the insulating substrate 2. Making the heat dissipating sheet 4 thicker can increase the stiffness of the heat dissipating sheet 4 and reduce deformation of the circuit board 1.

When the circuit board 1 is deformed, the stresses of the metal circuit sheet 3 and the heat dissipating sheet 4 and the stress caused by deformation of the insulating substrate 2 are superimposed and applied to the insulating substrate 2, and this reduces reliability of the circuit board 1. As described above, making the heat dissipating sheet 4 thicker can increase the stiffness of the heat dissipating sheet 4 and reduce deformation of the circuit board 1. Since this can reduce stress applied to the insulating substrate 2 by the deformation, it is possible to improve reliability of the circuit board 1.

Using copper to form the metal circuit sheet 3 and the heat dissipating sheet 4 is advantageous in improving the heat dissipation of the circuit board 1, because of high thermal conductivity of copper.

Using silicon nitride ceramic as a material for forming the insulating substrate 2 is advantageous in improving the reliability of the circuit board 1, because of high strength and high toughness properties of silicon nitride ceramic.

When the electronic device 10 includes the circuit board 1 in which the thicknesses t1 and t2 of the metal circuit sheet 3 and the heat dissipating sheet 4 satisfy the conditions described above, it is possible to realize a device which is capable of effectively dissipating heat generated from the electronic component 5 and is highly reliable.

For the thicknesses t1 and t2 of the metal circuit sheet 3 and the heat dissipating sheet 4, it is preferable not only to satisfy the conditions described above, but also to make the thickness t2 of the heat dissipating sheet 4 less than or equal to 5 mm. Thus, as shown in Table 2, it is possible to realize the circuit board 1 which not only achieves high heat dissipation and high reliability, but also is advantageous in terms of manufacturing cost.

For the thicknesses t1 and t2 of the metal circuit sheet 3 and the heat dissipating sheet 4, it is preferable not only to satisfy the conditions described above, but also to make the thickness t1 of the metal circuit sheet 3 larger than or equal to 0.4 mm. Thus, as shown in Table 2, it is possible to realize the circuit board 1 which not only achieves high heat dissipation and high reliability, but also is capable of reliably accommodating a large electric current.

REFERENCE SIGNS LIST

1 Circuit board
2 Insulating substrate
3 Metal circuit sheet

4 Heat dissipating sheet
5 Electronic component
6 Joining material
7 Joining material
8 Heat sink
10 Electronic device
11 First brazing material
12 Second brazing material
13 Conductive connecting member

The invention claimed is:

1. A circuit board comprising:
an insulating substrate;
a metal circuit sheet joined to a first principal surface of the insulating substrate; and
a heat dissipating sheet made of metal and joined to a second principal surface of the insulating substrate, the second principal surface being opposite the first principal surface,
wherein a thickness of the heat dissipating sheet is at least 3.75 times a thickness of the metal circuit sheet; and
a size of metal grains contained in the heat dissipating sheet is smaller than a size of metal grains contained in the metal circuit sheet, and decreases with increasing distance from the second principal surface of the insulating substrate.

2. The circuit board according to claim 1, wherein the first principal surface of the insulating substrate and the metal circuit sheet are joined together with a first brazing material interposed therebetween, and the second principal surface of the insulating substrate and the heat dissipating sheet are joined together with a second brazing material interposed therebetween; and
the first brazing material has, at least in an outer portion thereof, a thermal expansion coefficient higher than a thermal expansion coefficient of the second brazing material.

3. The circuit board according to claim 2, wherein the outer portion of the first brazing material is at least partly located outside an outer periphery of the metal circuit sheet.

4. The circuit board according to claim 1, wherein the thickness of the metal circuit sheet is 0.8 mm or less, the thickness of the heat dissipating sheet is 3 mm or more, and a sum of the thickness of the metal circuit sheet and the thickness of the heat dissipating sheet is 3.4 mm or more.

5. The circuit board according to claim 4, wherein the thickness of the heat dissipating sheet is 5 mm or less.

6. An electronic device comprising:
the circuit board according to claim 1; and
an electronic component mounted on the metal circuit sheet of the circuit board.

7. The circuit board according to claim 2, wherein the thickness of the metal circuit sheet is 0.8 mm or less, the thickness of the heat dissipating sheet is 3 mm or more, and a sum of the thickness of the metal circuit sheet and the thickness of the heat dissipating sheet is 3.4 mm or more.

8. The circuit board according to claim 7, wherein the thickness of the heat dissipating sheet is 5 mm or less.

* * * * *